US006930887B2

(12) United States Patent
Hartman (10) Patent No.: US 6,930,887 B2
(45) Date of Patent: Aug. 16, 2005

(54) METHOD AND SYSTEM FOR COUPLING A CHASSIS TO A RAIL

(75) Inventor: Corey Hartman, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 99 days.

(21) Appl. No.: 10/458,818

(22) Filed: Jun. 11, 2003

(65) Prior Publication Data

US 2004/0252465 A1 Dec. 16, 2004

(51) Int. Cl.[7] .................................................. H05K 7/16
(52) U.S. Cl. .................... 361/727; 361/724; 312/223.2; 312/223.3; 312/333
(58) Field of Search ................................ 361/683–686, 361/724–733, 610; 312/333, 334.44, 334.45, 334.46, 334.47, 330.1, 334.8, 319.1, 215, 222, 243, 273, 249.7, 249.8, 249.9, 249.11, 298, 301–303, 308, 310, 317.1, 317.2

(56) References Cited

U.S. PATENT DOCUMENTS

| 4,620,392 | A | * | 11/1986 | Kerpers et al. ................ 49/382 |
| 6,205,616 | B1 | * | 3/2001 | Hwang ......................... 16/229 |
| 6,209,979 | B1 | * | 4/2001 | Fall et al. .................. 312/330.1 |
| 6,601,933 | B1 | * | 8/2003 | Greenwald ................... 312/333 |
| 6,611,424 | B2 | * | 8/2003 | Huang ......................... 361/685 |
| 6,795,309 | B2 | * | 9/2004 | Hartung et al. ............. 361/685 |

OTHER PUBLICATIONS

U.S. Appl. No. 10/308,547, filed Dec. 3, 2002, entitled "Tool–Less Attachment Bracket" and naming Corey D. Hartman and Wayne E. McKinnon as inventors.

U.S. Appl. No. 10/278,263, filed Oct. 23, 2002, entitled "System and Method for Rack Cable Management" and naming Corey D. Hartman, Wayne E. McKinnon, Robert J. Neville, Jr., and Tyler L. Burgener as inventors.

U.S. Appl. No. 10/206,302, filed Jul. 26, 2002, entitled "System and Method for Utilizing Non–Dedicated Rack Space" and naming Terrence Q. E. Rafferty, Jason T. Runkle, Corey D. Hartman, Paul D. Higgins, and Tiffany J. Williams as inventors.

* cited by examiner

Primary Examiner—Lynn Feild
Assistant Examiner—Anthony Q. Edwards
(74) Attorney, Agent, or Firm—Hamilton & Terrile, LLP; Robert W. Holland (57) ABSTRACT

A chassis, such as an information handling system component housing, couples to opposing sliding rails with support posts that align with slots formed in the rails and a securing device that automatically engages to prevent removal of the chassis from the rails. The securing devices has a retractable button biased to an extended position with a spring and a block aligned so that insertion of the support posts in the slots compresses the button to a retracted position. The chassis slides relative to the rails so that the support posts position under lips of the slots and compression of the button is removed by removal of the block from a compressing position relative to the button. The extended button cooperates with the block to restrict movement of the chassis relative to the rail. Manual compression of the button permits movement of the chassis relative to the rail for removal of the supporting posts from under the lip and release of the chassis from the rail.

20 Claims, 6 Drawing Sheets

METHOD AND SYSTEM FOR COUPLING A CHASSIS TO A RAIL

BACKGROUND OF THE INVENTION

1. Field of the Invention

The present invention relates in general to the field of securing a chassis to a rail, and more particularly to a method and system for coupling an information handling system server chassis to a sliding rack rail.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the amount of information created, handled and stored by businesses increases the number of information handling systems needed by businesses has also increased. Often, businesses concentrate information handling systems in special rooms or confined spaces having limited accessibility. For instance, a server room is often set aside at a central location of a business with server information handling systems assembled in equipment racks. In order to improve access to individual server components, each server information handling system is typically supported on a set of sliding rails that extend outward from the rack. Information handling system manufacturers generally attempt to fit as much information handling power as practical in a given rack with racks and support rails typically built to standardized sizes. However, as greater numbers of more powerful components are placed in a server rack, obtaining access to the components for replacement or maintenance becomes increasingly difficult. To reduce the difficulty of obtaining access to components, manufacturers have attempted to couple components to rack rails with a variety attachment devices, including post and slot arrangements that are locked in place with screws.

Although screws will securely couple a chassis to a rack rail, the use of tools and small screws around electronic equipment is undesirable due to the danger of electric shock and due to the general need for multiple technicians to secure the post and screws. Manufacturers have thus looked for tool-less attachment devices that do not have removable screws and that allow a chassis to be "drop-and-locked" to a rail for secure attachment of the chassis by a single technician. One difficulty with such tool-less devices for securing an information handling system chassis to server rack rails is that the small available space tends to call for small solutions that are easily overcome or broken with the application of relatively small amounts of force. Thus, users faced with complex mechanisms in reduced space easily break such attachment devices during removal or maintenance of the server information handling system component. Another difficulty is that racks come in a variety of standardized sizes so that different securing solutions are often used for different sized racks, chassis and rails. The use of different solutions tends to increase the confusion of users in the operation of securing devices and thus increases the likelihood of the use of excess force that will result in damage to the securing devices.

SUMMARY OF THE INVENTION

Therefore a need has arisen for a method and system which secures a chassis to a rail with an integrated tool-less and easy-to-use secure attachment device.

A further need exists for a method and system which secures information handling system server components to server rack rails in a simple and uniform manner.

In accordance with the present invention, a method and system are provided which substantially reduce the disadvantages and problems associated with previous methods and systems for securing a chassis to a rail, such as an information handling system server chassis to a server rack rail. A chassis secures to a rail with a securing device that automatically engages to restrict movement of the chassis relative to the rail upon insertion of a support post in a slot of the rail. The chassis is removed from the rails by manual operation of the securing device to permit movement of the chassis relative to the rail.

More specifically, the securing device comprises a retractable button mechanism coupled to a rail end and a block coupled to the chassis. The block and button align so that the block compresses the button when securing posts that are coupled to the chassis are inserted into slots formed in the rail. The slots are formed to have an opening that accepts the support posts and then extends horizontally along the rail to define a support surface and an upper lip. The support posts are formed to fit in the slot opening and to slide under the upper lip so that the support posts and slots capture the chassis in five translational directions. As the support posts slide under the upper lip, the block and button unalign so that the button extends to interact with the block to capture the chassis in the sixth translational direction by preventing the support posts from sliding from under the upper lip. The chassis is removed from the rail by manual activation to compress the button and allow the support posts to slide from under the upper lip for removal through the slot opening. A plurality of information handling system server components may be stored in a rack having plural opposing rail pairs with each rail having a button mechanism and each component housing having a block aligned with a button.

The present invention provides a number of important technical advantages. One example of an important technical advantage is that a chassis is secured to rails with an integrated tool-less attachment device. Tool-less attachment with the securing device allows a single technician to drop a chassis into a secured position with a simple insertion motion of sliding posts under the upper lip. Removal of the chassis is accomplished by manual activation of the securing device and an inverse sliding motion. Both the insertion and removal of the chassis are performed without a need for a technician to alter a supporting grasp on the chassis.

Another example of an important technical advantage of the present invention is that information handling system server components are secured to server rack rails in a simple and uniform manner. Opposing buttons at the rail ends are easily accessible and activated with a simple and intuitive press and slide operation to enable a single technician to add or remove server components to a rack having plural rail pairs for supporting plural components. The button mechanism is sturdy to reduce the risk of breakage from excess force and uniformly applicable across a variety of rack and chassis sizes.

Another example of an important technical advantage of the present invention is that the securing device is connected to the end of the slide that extends from the server rack so that the securing device is easily adapted for use on any type of rack slide, independent of slide geometry, size or manufacturer. In contrast, securing devices that are internal to a slide generally only operate on slides of similar size and geometry and generally do not work on smaller sized slides. The external placement of the securing device supports interchangeable use of the same sized securing device across a variety slide designs independent of actual slide geometry.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling system server component chassis are secured and released from rack rail pairs with a securing device that automatically restricts movement of the chassis relative to the rail. Manual activation of the securing device allows motion of the chassis relative to the rail to remove the information handling system chassis from the rail. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
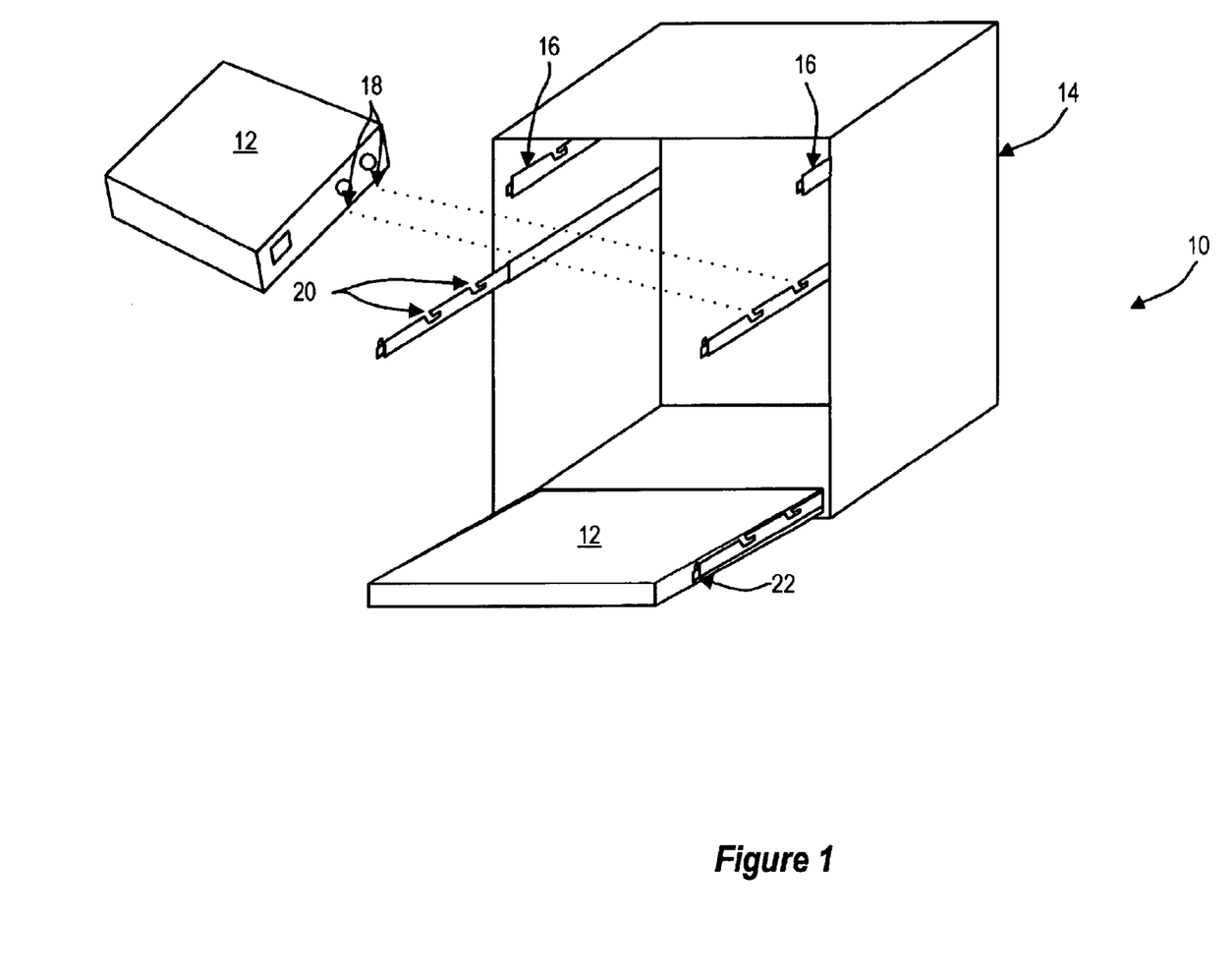
FIG. 1 depicts a server information handling system configured with plural opposing rail pairs having a securing device.

Referring now to FIG. 1, a server information handling system 10 is depicted with plural server component housing chassis 12 supported in a server rack 14 on plural opposing pairs of sliding rails 16. Technicians gain access to information handling system components by sliding a chassis 12 out from rack 14 with sliding rails 16 and removing chassis 12. Information handling system components are safely stored in reduced space by placing the components in plural chassis 12, securing each chassis 12 to an opposing pair of rails 16 and sliding the chassis into server rack 14. Each chassis 12 is secured to an associated opposing pair of rails 16 by support posts 18 that fit in rail slots 20 and a securing device 22 that prevents chassis from inadvertently falling from rack 14 to cause damage to the information handling system components or injury to technicians. Supports posts 18 and slots 20 are formed to restrict motion of chassis 12 relative to rail 16 in five translational directions, and securing device 22 automatically engages upon full insertion of supports posts 18 in slots 20 to restrict motion of chassis 12 relative to rail 16 in the sixth translational direction. Chassis 12 is removed from rails 16 by manual activation of the securing device to release motion of chassis 12 relative to rail 16 in the sixth translation direction and allow chassis 12 to be removed from slots 20.

Figure 2:
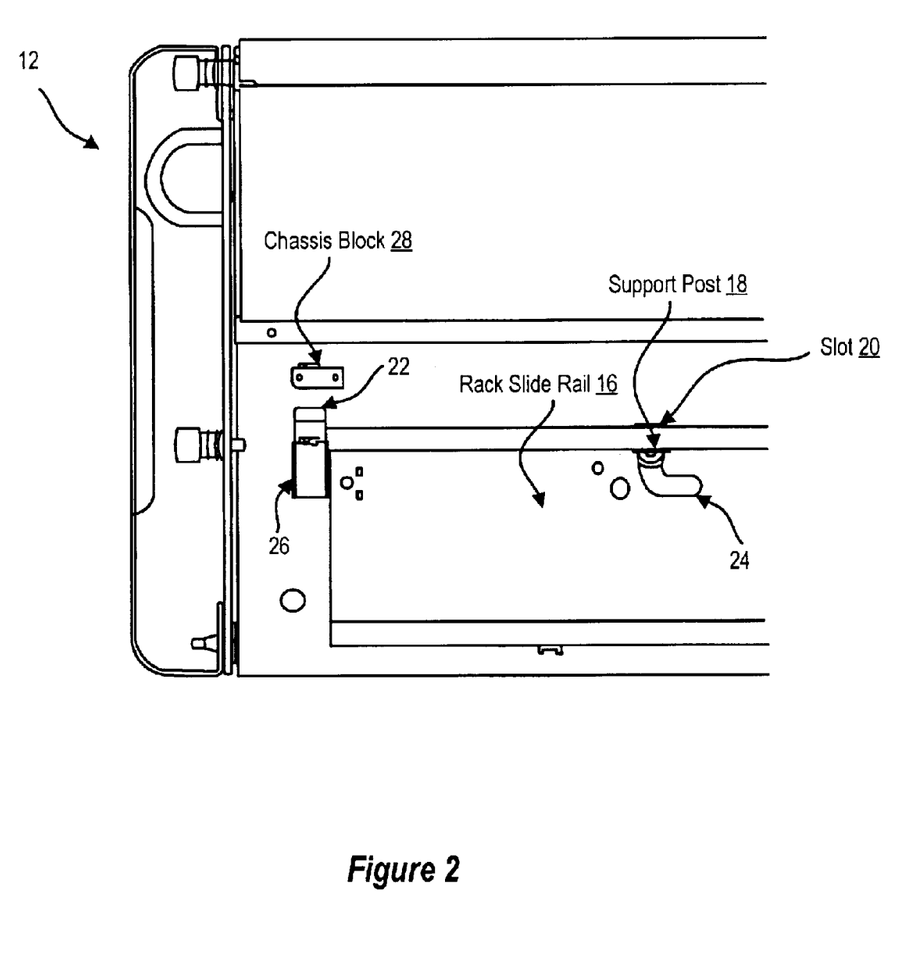
FIG. 2 depicts a side view of insertion of a support post in a rail slot with the securing device button and block aligned.
Figure 3:
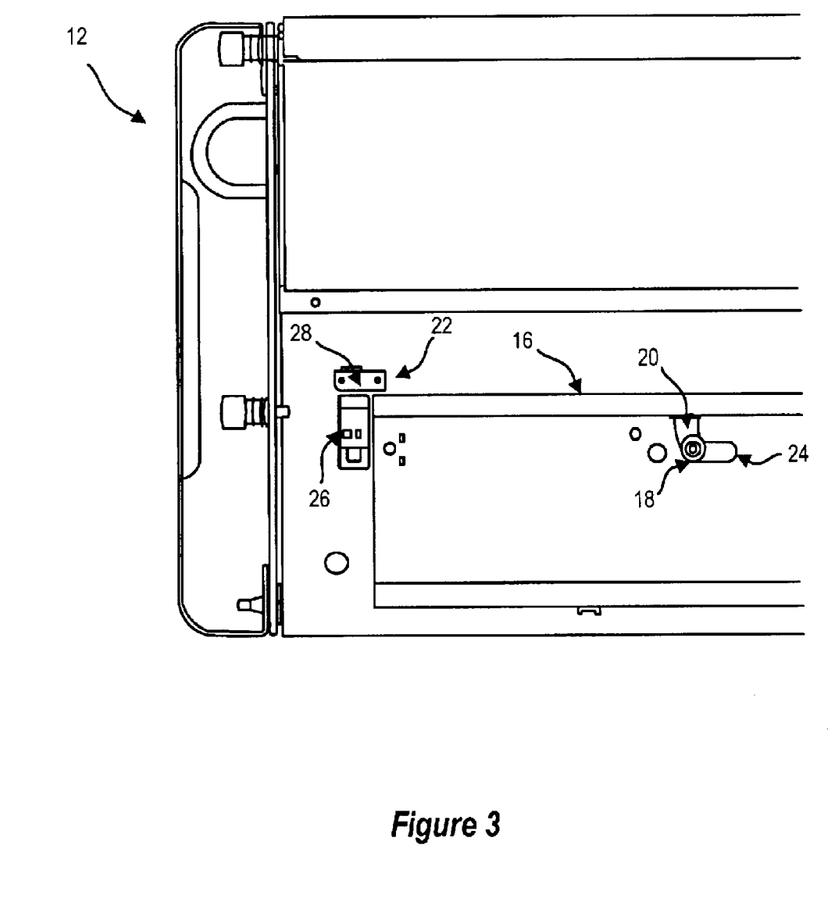
FIG. 3 depicts the securing device button compressed by the chassis block with the support post resting on the support surface in an unsecured position.
Figure 4:
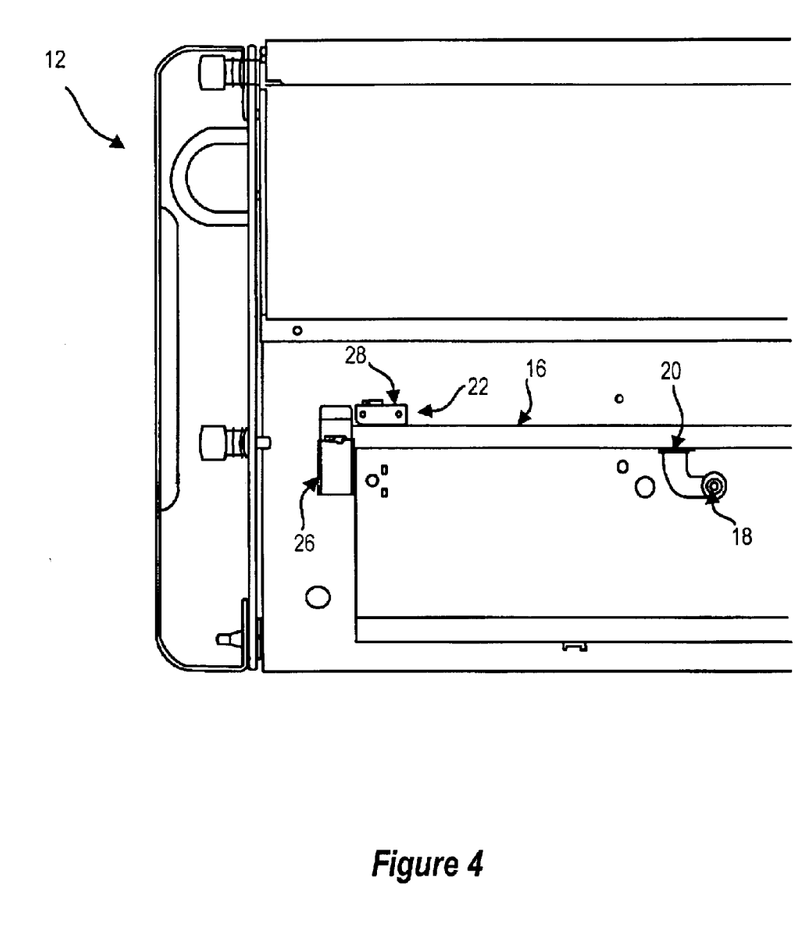
FIG. 4 depicts the support post slid under the slot upper lip to release the securing device button to an extended position that secures the chassis from movement relative to the rail.

Referring now to FIGS. 2, 3 and 4, one embodiment of securing device 22 is depicted securing an information handling system server component chassis housing 12 to a rack slide rail 16. Support post 18 couples to chassis 12 and aligns with slot 20, which is formed with an opening sized to accept insertion of support post 18. For instance, support post 18 is a shoulder screw having an end with a width that fits in the upper opening of slot 20 and having a tapered connection to chassis 12 so the tapered connection of support post 18 fits through the side opening of slot 20 but the wider end of support post 18 does not fit through the side opening and is thus captured by slot 20. Support post 18 drops vertically into the opening of slot 20 and slides horizontally along slot 20 to rest under an upper lip 24 formed in slot 20. Slot 20 and support post 18 are thus shaped to capture chassis 12 in all six translational directions except for horizontal translational movement between a position under the opening of slot 20 and a position under the upper lip 24. Upon insertion of support post 18 into slot 20 and under upper lip 24, securing device 22 secures chassis 12 to rail 16 in the sixth translational direction.

Securing device 22 has a retractable button 26 coupled to the extended end of rail 16 and a chassis block 28 coupled to chassis 12 that interact to control movement of chassis 12 relative to slide 16 in the horizontal translational direction. As support post 18 aligns with and enters the opening of slot 20, block 28 aligns with button 26 so that the bottom surface of block 28 contacts the upper surface of button 26 to place a compressing force button 26. As depicted by FIG. 3, once support post 18 is lowered to contact the bottom support surface of slot 20, block 28 compresses button 26 with the weight of chassis 12 by contact of the bottom surface of block 28 with the upper surface of button 26. However, the position depicted by FIG. 3 is an unsecured position in that chassis 12 is not restricted from removal from rail 16 by lifting support post 18 out of slot 20.

Chassis 12 is secured to rail 16 by sliding chassis 12 horizontally relative to rail 16 so that support post 18 slides under upper lip 24 and securing device 22 engages to restrict movement of chassis 12 relative to rail 16 so that support post 18 remains under upper lip 24. As depicted by FIG. 4, horizontal translational movement of chassis 12 relative to rail 16 removes the upper surface of button 26 from under block 28 to allow button 26 to extend upward so that the side surface of button 26 interacts with the side surface of block 28. The automatic extension of button 26 from the compressed retracted position to the extended position restricts horizontal translational movement of chassis 12 relative to rail 16 with contact of the side surfaces of button 26 and block 28 so that support post 18 remains under upper lip 24 to secure chassis 12 to rail 16. Removal of chassis 12 from rail 16 is accomplished by manual compression of button 26 to allow horizontal translational movement of chassis 12 relative to rail 16 with the upper surface of the compressed button sliding under the lower surface of block 28 until support post 18 aligns with the opening of slot 20. In alternative embodiments, button 26 may be coupled to chassis 12 instead of to rail 16 to interact with a block coupled to rail 16, and may be placed at other locations along the length of rail 16. In order to simplify operation securing device 22, instructions or color coding may be applied to button 26 or chassis 12. Further, the dimensions of securing device 22, slot 20 and support post 18 may be adjusted for variously-sized chassis 12 are rails 16 without substantially altering the operation of the securing device.

Figure 5A:
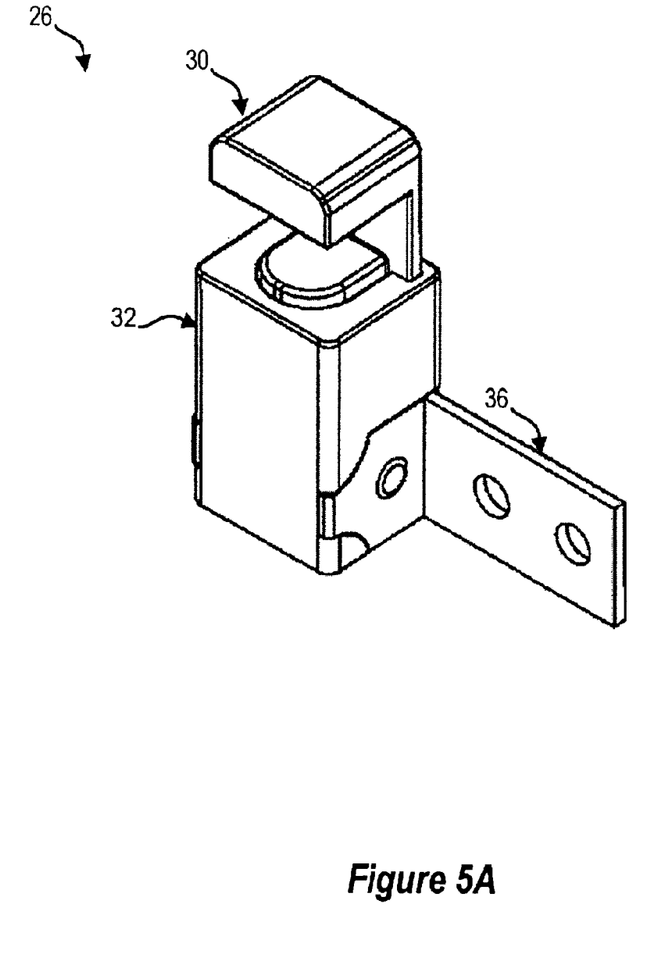
FIGS. 5A and 5B depict assembled and blow-up views of the securing device button.
Figure 5B:
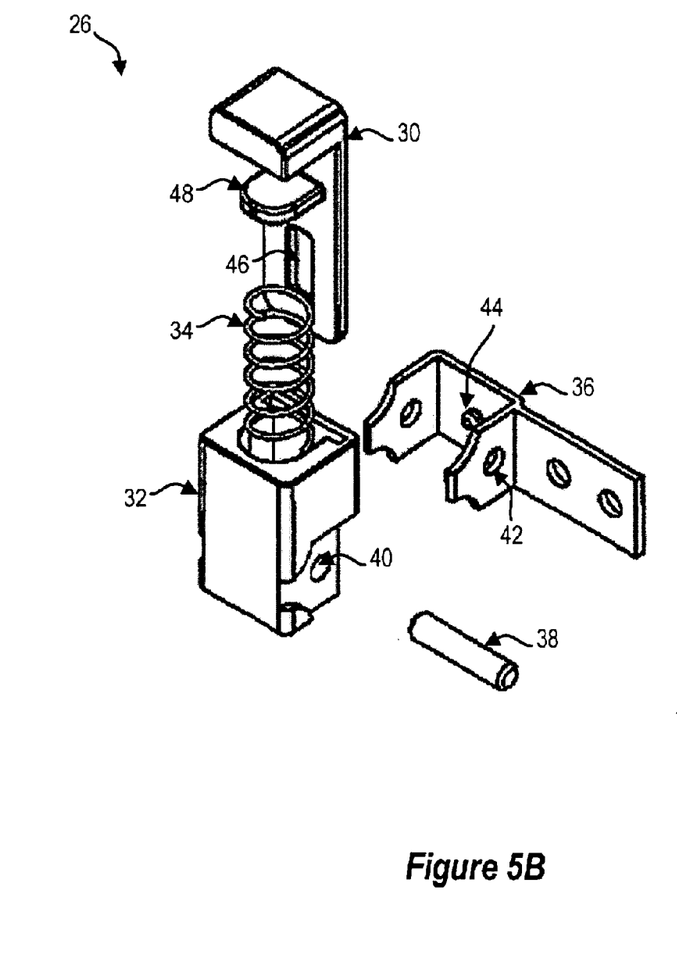

Referring now to FIGS. 5A and 5B, one embodiment of button 26 is depicted assembled and as a blow-up. A plunger 30 forms the upper contact surface of button 26 and inserts in a housing 32 over a spring 34. Housing 32 is sized to fit plunger 30 securely but to allow movement along a vertical axis. Spring 34 biases plunger 30 to an extended position and allows compression of plunger 30 by a compressive force asserted against the upper surface of plunger 30 by a block coupled to a chassis. Housing 32 is coupled to a rail with a bracket 36. A pin 38 holds together the assembled plunger 30, housing 32 and bracket 36 by inserting through an opening 40 in housing 32 and an opening 42 in bracket 36. A guide pin 44 extends from bracket 36 through housing 32 and into a vertical slot 46 formed in plunger 30. Vertical slot 46 defines the motion in the vertical axis along the length of housing 32 that plunger 30 travels. Spring 34 provides the bias for plunger 30 to remain in the extended position by pushing against a spring support 48 that traps spring 34 within housing 32. Bracket 36, plunger 30 and housing 32 are symmetrical about their axes of attachment so that the parts are interchangeable for left or right hand assembly.

Although the present invention has been described in detail, it should be understood that various changes, substitutions and alterations can be made hereto without departing from the spirit and scope of the invention as defined by the appended claims.

What is claimed is:

1. An information handling system comprising:
    a rack having plural rail supports;
    plural rail pairs operable to extend from the rack in substantially parallel alignment, each rail having at least one retaining slots, each retaining slot having an opening with an upper lip;
    plural chassis, each chassis having plural retaining posts aligned with the retaining slots of a rail pair; and
    securing devices coupled to each rail distal the slots and each chassis distal the posts, each securing device having a button and a block aligned with the button, the block operable to refract the button when the chassis retaining posts are placed in the retaining slot openings and to release the button to extend when the retaining posts are moved below the upper lip, the extended button retaining the chassis position relative to the rail so that the posts are retained below the upper lip.

2. The information handling system of claim 1 wherein a button is mounted on each rail and a block associated with each button is mounted on each chassis.

3. The information handling system of claim 2 wherein the buttons are mounted at the rail ends.

4. The information handling system of claim 1 wherein a button is mounted on opposing sides of each chassis and a block associated with each button is mounted on each rail.

5. The information handling system of claim 1 wherein the button comprises a spring aligned to bias the button to an extended position.

6. A system for securing a chassis to a rail, the system comprising:
    a support surface formed as a slot in the rail, the slot extending horizontally for a predetermined distance to form an upper lip;
    a block extending from the chassis proximate the rail;
    a support post extending from the chassis and aligned with the slot; and
    a button located distal the slot and extending from the rail and aligned with the block, the button operable to retract on contact with the block to allow insertion of the support post in the slot and biased to extend proximate the block upon sliding of the support post under the upper lip, the extended button interacting with the block to prevent sliding of the support post from under the upper lip.

7. The system of claim 6 wherein the button is further operable to manually compress to allow sliding of the support post from under the upper lip for removal of the chassis from the rail.

8. The system of claim 7 wherein the chassis comprises an information handling system housing.

9. The system of claim 7 wherein the button comprises:
    a housing having a vertically aligned opening;
    a spring located in the housing; and
    a contact member inserted in the opening and interacting with the spring to bias to an extended position.

10. The system of claim 7 further comprising:
    plural support surfaces, each support surface formed as a slot; and
    plural support posts, each support post aligned to insert in a support surface slot.

11. The system of claim 6 wherein the support post comprises a shoulder screw sized to fit into and be held by the slot.

12. A method for securing a chassis to a set of opposing support rails, the method comprising:
    aligning support posts extending from the chassis with slots formed in the support rails;
    aligning a retractable button located distal the slots coupled to each support rail with blocks extending from the chassis;
    inserting the support posts into the slots to compress the retractable buttons by contact of the buttons' surfaces with the blocks;

sliding the support posts in the slots to a position under a slot lip formed in each slot; and extending the buttons by sliding the buttons relative to the blocks to remove the button surfaces from compressed contact with the blocks, the extended buttons contacting the blocks to prevent sliding of the support posts from the position under the slot lips.

13. The method of claim 12 further comprising:

manually compressing the buttons;

sliding the buttons under the blocks to remove the support posts from under the slot lips; and removing the chassis from the rails by removing the support posts from the slots.

14. The method of claim 12 wherein the chassis comprises and information handling system housing.

15. The method of claim 12 wherein extending the buttons comprises biasing the buttons to an extended position with springs.

16. The method of claim 12 wherein the support posts and slots cooperate to restrict motion of the chassis relative to the rails in five translational directions and the extended button cooperates with the block to restrict motion of the chassis relative to the rails in a sixth translational direction.

17. A method for securing a chassis to a rail, the method comprising:

coupling a support post to the chassis;

inserting the support post in a slot of the rail;

sliding the support post under a lip of the slot; and automatically engaging a securing device coupled to the rail and located distal the slot of the rail to restrict movement of the support post from under the lip of the slot.

18. The method of claim 17 wherein automatically engaging a securing device further comprises:

retracting a button by compression with a block during insertion of the support post in the slot; and extending the button by removing compression by the block during sliding of the support post under the lip.

19. The method of claim 17 further comprising:

manually disengaging the securing device to allow movement of the support post from under the lip of the slot; and removing the chassis from the rail by removing the support post from the slot.

20. The method of claim 19 wherein manually disengaging the securing device further comprises:

manually compressing a button; and sliding the button under a block to allow movement of the support post from under the lip.

* * * * *